US012656394B2

(12) United States Patent
Yamazaki

(10) Patent No.: US 12,656,394 B2
(45) Date of Patent: Jun. 16, 2026

(54) MEMORY, MEMORY SYSTEM AND METHOD OF CONTROLLING STORAGE DEVICE

(71) Applicant: Kioxia Corporation, Tokyo (JP)

(72) Inventor: Atsushi Yamazaki, Tokyo (JP)

(73) Assignee: Kioxia Corporation, Tokyo (JP)

( * ) Notice: Subject to any disclaimer, the term of this patent is extended or adjusted under 35 U.S.C. 154(b) by 222 days.

(21) Appl. No.: 18/463,730

(22) Filed: Sep. 8, 2023

(65) Prior Publication Data

US 2024/0094286 A1 Mar. 21, 2024

(30) Foreign Application Priority Data

Sep. 21, 2022 (JP) ................................. 2022-150413

(51) Int. Cl.
| | |
|---|---|
| *G06F 15/16* | (2006.01) |
| *G01R 31/317* | (2006.01) |
| *G06F 9/54* | (2006.01) |
| *H04L 29/06* | (2006.01) |

(52) U.S. Cl.
CPC . *G01R 31/31719* (2013.01); *G01R 31/31705* (2013.01); *G01R 31/31727* (2013.01)

(58) Field of Classification Search
CPC ........ G01R 31/31719; G01R 31/31705; G01R 31/31727; G06F 21/79; G06F 21/44; G06F 2221/2129; G06F 2201/88; G06F 11/3648; G06F 2201/81; G06F 11/076; G06F 11/0778
USPC ........................................................ 726/26
See application file for complete search history.

(56) References Cited

U.S. PATENT DOCUMENTS

| | | | | |
|---|---|---|---|---|
| 7,117,352 B1 * | 10/2006 | Giles | ................ | G01R 31/31719 |
| | | | | 713/2 |
| 8,276,199 B2 * | 9/2012 | Xu | ........................... | G06F 11/26 |
| | | | | 726/17 |
| 8,549,368 B1 * | 10/2013 | Deogharia | ............. | G11C 29/48 |
| | | | | 714/733 |
| 8,832,440 B2 | 9/2014 | Johnson et al. | | |
| 10,078,113 B1 * | 9/2018 | Usgaonkar | ............ | G06F 11/322 |
| 10,852,352 B2 | 12/2020 | Rahardjo et al. | | |

(Continued)

FOREIGN PATENT DOCUMENTS

| | | | | | |
|---|---|---|---|---|---|
| CN | 118113544 A | * | 5/2024 | ............. | G06F 13/10 |
| KR | 20230090210 A | * | 6/2023 | ............. | G06F 21/71 |

(Continued)

*Primary Examiner* — Hamza N Algibhah

(74) *Attorney, Agent, or Firm* — Foley & Lardner LLP

(57) ABSTRACT

A memory having a first authentication code includes a communication port configured to transmit information including debug data to or receive the information including debug data from the external device; and a debug port controller that is usable for blocking of a communication path connecting to the communication port. The debug port controller is configured to receive an authentication request including a second authentication code from an external device, determine whether the second authentication code matches the first authentication code, and block the communication path if the second authentication code is not determined to match the first authentication code. The communication port may be configured to be disabled until the second authentication code matches the first authentication code.

17 Claims, 6 Drawing Sheets

(56)         References Cited

U.S. PATENT DOCUMENTS

| | | | | |
|---|---|---|---|---|
| 11,113,399 | B2 | 9/2021 | Yamada et al. | |
| 11,362,830 | B2 | 6/2022 | Kanbe | |
| 11,892,505 | B1* | 2/2024 | Goyal | G06F 11/3648 |
| 2003/0046610 | A1* | 3/2003 | Yamamoto | G06F 11/28 |
| | | | | 714/E11.178 |
| 2010/0263043 | A1* | 10/2010 | Xu | G06F 11/26 |
| | | | | 726/17 |
| 2013/0297960 | A1* | 11/2013 | Quinton | G06F 11/26 |
| | | | | 713/400 |
| 2013/0340068 | A1* | 12/2013 | Lee | G06F 21/70 |
| | | | | 726/16 |
| 2014/0016776 | A1* | 1/2014 | Van Foreest | G06F 21/73 |
| | | | | 380/46 |
| 2015/0331043 | A1* | 11/2015 | Sastry | G01R 31/3177 |
| | | | | 714/726 |
| 2017/0103221 | A1* | 4/2017 | Goel | G06F 11/3636 |
| 2019/0097785 | A1* | 3/2019 | Elenes | G11C 7/24 |
| 2019/0122007 | A1* | 4/2019 | Van Antwerpen | G06F 21/602 |
| 2019/0129774 | A1* | 5/2019 | Konan | G06F 11/0778 |
| 2019/0180010 | A1* | 6/2019 | Ryu | H04L 9/3226 |
| 2020/0134142 | A1* | 4/2020 | Kim | H04L 9/3228 |
| 2021/0192085 | A1* | 6/2021 | Shah | G06F 11/3648 |
| 2021/0203670 | A1* | 7/2021 | Woodland | G06F 21/725 |
| 2022/0027519 | A1* | 1/2022 | Kataria | H04L 63/10 |
| 2022/0058295 | A1 | 2/2022 | Boehm et al. | |
| 2022/0120804 | A1* | 4/2022 | Khare | G01R 31/2601 |
| 2022/0120809 | A1* | 4/2022 | Porst | G01R 31/3177 |
| 2022/0206692 | A1* | 6/2022 | Choi | G06F 21/62 |
| 2022/0350875 | A1* | 11/2022 | Golombek | G06F 21/44 |
| 2022/0366025 | A1* | 11/2022 | Kim | G06F 21/44 |
| 2023/0083979 | A1* | 3/2023 | Mitchell | G06Q 10/0837 |
| | | | | 726/26 |
| 2023/0090760 | A1* | 3/2023 | Liew | G01R 31/31719 |
| | | | | 713/167 |
| 2023/0109592 | A1* | 4/2023 | Rokhsaz | G06K 19/0776 |
| | | | | 709/223 |
| 2023/0152988 | A1* | 5/2023 | Lee | G06F 3/0656 |
| | | | | 711/154 |
| 2023/0188326 | A1* | 6/2023 | Lee | H04L 9/0825 |
| 2024/0176864 | A1* | 5/2024 | Chbani | G06F 21/44 |
| 2025/0077715 | A1* | 3/2025 | Hernes | G06F 21/75 |

FOREIGN PATENT DOCUMENTS

| | | |
|---|---|---|
| TW | 1330800 B | 9/2010 |
| TW | 1716023 B | 1/2021 |
| TW | 1738020 B | 9/2021 |

* cited by examiner

2: MEMORY SYSTEM

2b: MEMORY SYSTEM

MEMORY, MEMORY SYSTEM AND METHOD OF CONTROLLING STORAGE DEVICE

CROSS REFERENCE TO RELATED APPLICATIONS

This application is based upon and claims the benefit of priority from the prior Japanese Patent Application No. 2022-150413, filed on Sep. 21, 2022, the entire contents of which are incorporated herein by reference.

FIELD

Embodiments described herein relate generally to a semiconductor memory, a memory system and a method of controlling storage device.

BACKGROUND

During a performance evaluation performed before a semiconductor memory is shipped for sale, a function verification of the semiconductor memory may be performed. A debug port may be provided to the semiconductor memory, and the function verification of the semiconductor memory may be performed by an evaluation device via the debug port.

The debug port should be disabled before the semiconductor memory is shipped for sale, since there is a risk that an internal function of the semiconductor memory may be analyzed by a third party through the debug port.

DETAILED DESCRIPTION

Figure 1:
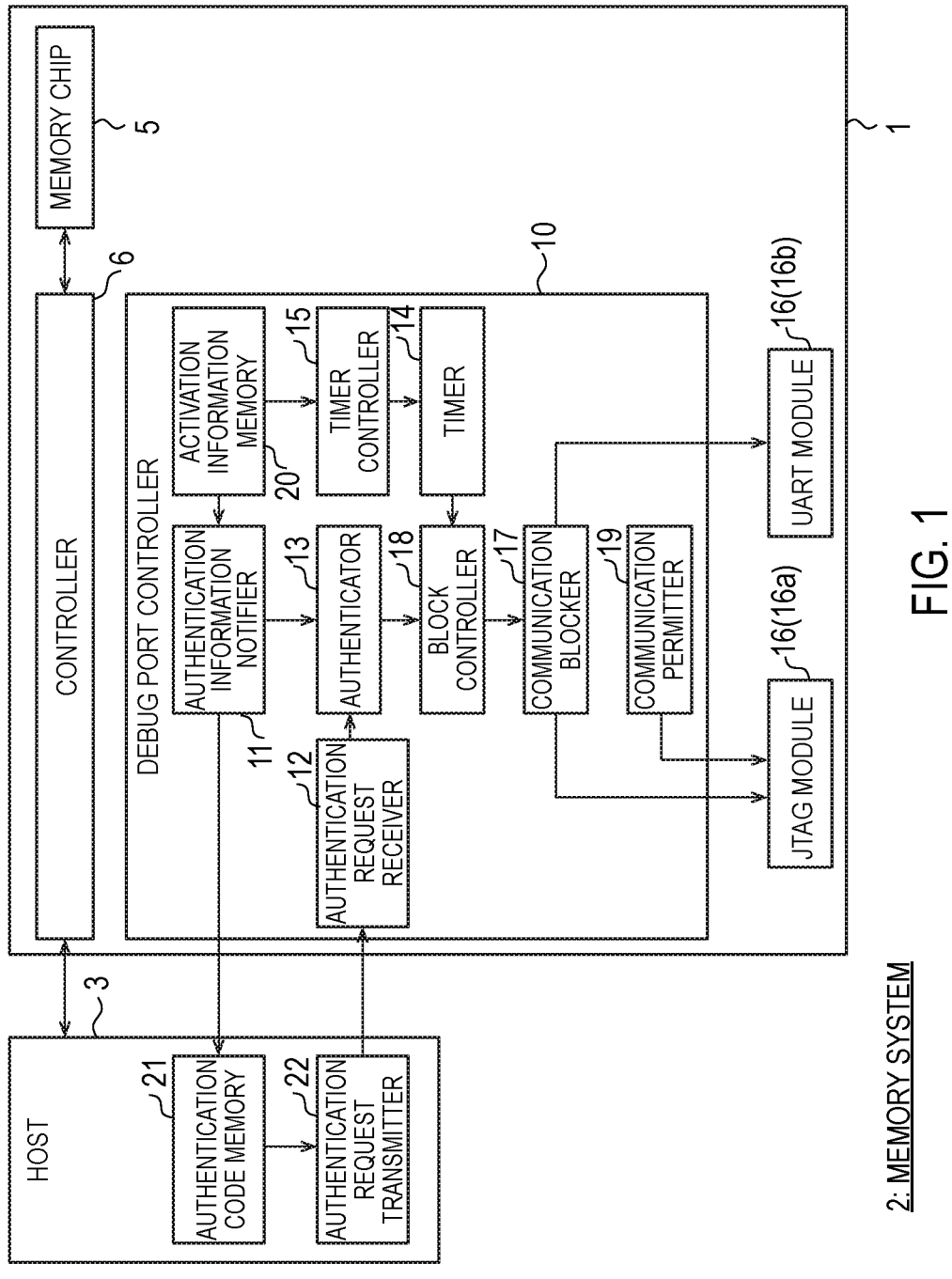
FIG. 1 is a block diagram illustrating a configuration of a memory system according to a first embodiment.

In general, according to the embodiment, a memory having a first authentication code includes a communication port configured to transmit information including debug data to or receive the information including debug data from the external device, and a debug port controller that is usable for blocking of a communication path connecting to the communication port. The debug port controller is configured to receive an authentication request including a second authentication code from an external device, determine whether the second authentication code matches the first authentication code, and block the communication path if the second authentication code is not determined to match the first authentication code.

Embodiments of a semiconductor memory and a memory system will now be described below with reference to the accompanying drawings. In the following descriptions, major components of the semiconductor memory and the memory system will be mainly explained. However, the semiconductor memory and the memory system may have a component or a function that is not described herein or illustrated in the drawings. The following descriptions do not exclude such a component or function.

First Embodiment

FIG. 1 is a block diagram illustrating a memory system 2 according to a first embodiment. The memory system 2 according to the first embodiment includes a semiconductor memory 1 and a host 3. In an example shown in FIG. 1, two communication ports 16 are provided, one being a JTAG module, and the other being a universal asynchronous receiver/transmitter (UART) module. These modules are examples of the communication port 16. The JTAG module could be a debug port. The UART module also could be used as a debug port.

The semiconductor memory 1 is, for example, a solid-state drive (SSD) including a NAND flash memory. The semiconductor memory 1 may include a nonvolatile memory other than the NAND flash memory, or a volatile memory.

The host 3 is an electronic device such as a personal processor (PC), a smartphone, or a tablet. The host 3 may be a central processing unit (CPU). The host 3 performs processing for writing data to the semiconductor memory 1 and processing for reading data from the semiconductor memory 1. The writing of data to and the reading of data from the semiconductor memory 1 are comprehensively called "access" herein. At the first activation, the host 3 receives an authentication information notification from the semiconductor memory 1, and stores an authentication code of the semiconductor memory 1 included in the authentication information notification.

The semiconductor memory 1 includes an authentication information notifier 11, an authentication request receiver 12, an authenticator 13, a timer 14, a timer controller 15, a communication port 16, a communication blocker 17, and a block controller 18. The semiconductor memory 1 may also include a communication permitter 19. The semiconductor memory 1 shown in FIG. 1 may also include an activation information memory 20. The authentication information notifier 11, the authentication request receiver 12, the authenticator 13, the timer 14, the timer controller 15, the communication blocker 17, the block controller 18, the communication permitter 19, and the activation information memory 20 are main components of the semiconductor memory 1. The main components of the semiconductor memory 1 may be collectively called a "debug port controller 10." The semiconductor memory 1 also includes a memory chip 5 and a controller 6 configured to control access to the memory chip 5.

At the first activation, the authentication information notifier 11 sends the authentication information notification including an authentication code to a connected device. The "first activation" means the occasion when the semiconductor memory 1 is first activated.

The authentication request receiver 12 receives an authentication request from the outside. The authentication request includes the authentication code that has been sent from the semiconductor memory 1 in advance. The authentication request may be in a form of a command, for example. In this case, the authentication code is included in a parameter of the command. The authentication request may be in a form of a packet. In this case, the authentication code is included in the packet.

The authenticator 13 determines whether the authentication code included in the authentication request matches the authentication code included in the authentication information notification. The authenticator 13 determines that the authentication is successful only when the authentication code included in the authentication request matches the authentication code included in the authentication information notification. That is, the authenticator 13 determines that the authentication is successful only when the authentication code sent to the outside by the semiconductor memory 1 is received from the outside.

The timer 14 measures time at the activation for the second or later time of the semiconductor memory 1. After the first activation, every time the semiconductor memory 1 is activated, the timer 14 measures time until a predetermined time is reached. The occasion on which the time measured by the timer 14 reaches the predetermined time will be called herein a "time-up" occasion or the occasion where the operation of the timer 14 is completed. The period of time until the time-up occasion of the timer 14 is determined in consideration of the period of time in which the authentication request from the host 3 reaches the semiconductor memory 1 and the period of time required for the authentication processing in the authenticator 13. In order to prevent the spoofing of the host 3, the time until the time-up occasion is preferably set as short as possible in consideration of the above-described two periods of time.

If the authenticator 13 determines that the authentication codes match each other, the timer controller 15 stops the timer 14. If the authenticator 13 determines that the authentication codes do not match each other, the timer controller 15 may stop the time measurement performed by the timer 14.

The communication port 16 is used to transmit or receive information including debug data between an external device and the semiconductor memory 1. There may be a plurality of communication ports 16. Each of the plurality of communication ports 16 may independently transmit or receive information. Two or more communication ports 16 in sync with each other may transmit or receive information. The external device may be the host 3, or an inspection device or an evaluation device other than the host 3. The communication port 16 used for the debugging will be called "debug port" herein.

The communication blocker 17 may be, for example, an electronic fuse. The communication blocker 17 may electrically block a communication path. The communication path blocked by the communication blocker 17 is not allowed to be reconnected.

If the authenticator 13 determines that the authentication codes do not match each other, the block controller 18 causes the communication blocker 17 to block the communication path by sending a block instruction signal to the communication blocker 17. Upon the receipt of the block instruction signal, the communication blocker 17 electrically blocks the communication path.

The communication permitter 19 permits the communication port 16 to start communications after the timer controller 15 stops the timer 14. In other words, the communication permitter 19 at least partially disables the communication ports 16 until the authenticator 13 determines that the authentication codes match each other. This may avoid the risk of unauthorized use of the communication ports 16 before the time-up occasion of the timer 14.

The activation information memory 20 stores activation information as to whether the semiconductor memory 1 connected to the host 3 is activated for the first time. The activation information may be a flag generated by software, for example. The activation information is stored in a nonvolatile storage region of the semiconductor memory 1.

The memory chip 5 is, for example, a chip including a NAND flash memory. The debug port controller 10 including the authentication information notifier 11, the authentication request receiver 12, the authenticator 13, the timer 14, the timer controller 15, the communication port 16, the communication blocker 17, and the block controller 18 described above may be disposed separate from the controller 6, or may be included in the controller 6.

The controller 6 is a chip configured to access the memory chip 5 in accordance with an instruction from the host 3. The controller 6 may be a system-on-chip (SoC). The controller 6 may control the operation of the debug port controller 10.

The host 3 according to the first embodiment includes an authentication code memory 21 and an authentication request transmitter 22.

The authentication code memory 21 stores an authentication code included in the received authentication information notification. If the host 3 is connected to a plurality of semiconductor memories 1, the authentication code memory 21 stores a corresponding authentication code of each semiconductor memory 1.

The authentication request transmitter 22 transmits an authentication request including the authentication code read from the authentication code memory 21 to the semiconductor memory 1 that is connected to the host 3.

Figure 2:
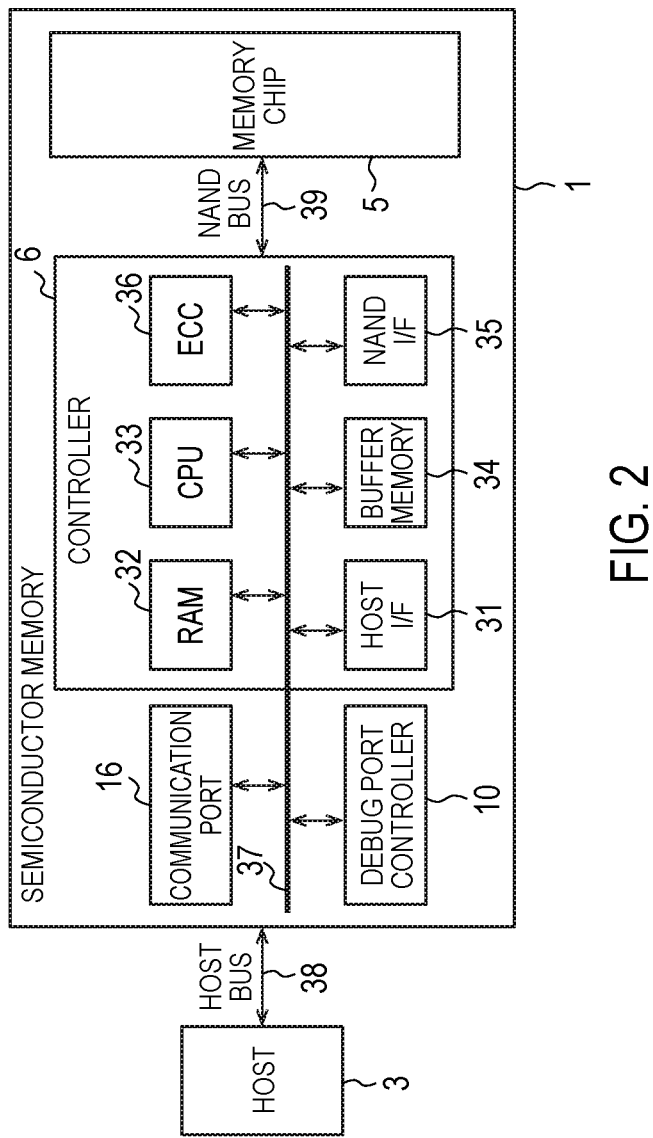
FIG. 2 is a block diagram more specifically illustrating an internal configuration of a controller included in the memory system according to the first embodiment.

FIG. 2 is a block diagram more specifically illustrating an internal configuration of the controller 6 included in the memory system 2 according to the first embodiment.

The semiconductor memory 1 is connected to the host 3 via a host bus 38.

The controller 6 of the semiconductor memory 1 includes a host interface circuit (host I/F) 31, a built-in memory (RAM) 32, a processor (CPU) 33, a buffer memory 34, a NAND interface circuit (NAND I/F) 35, and an error checking and correcting (ECC) circuit 36.

The components 31 to 36 included in the controller 6 are connected to a common bus 37. The debug port controller 10 and the communication port 16 are also connected to the bus 37. The controller 6 is connected to the memory chip 5 via a NAND bus 39.

Figure 3:
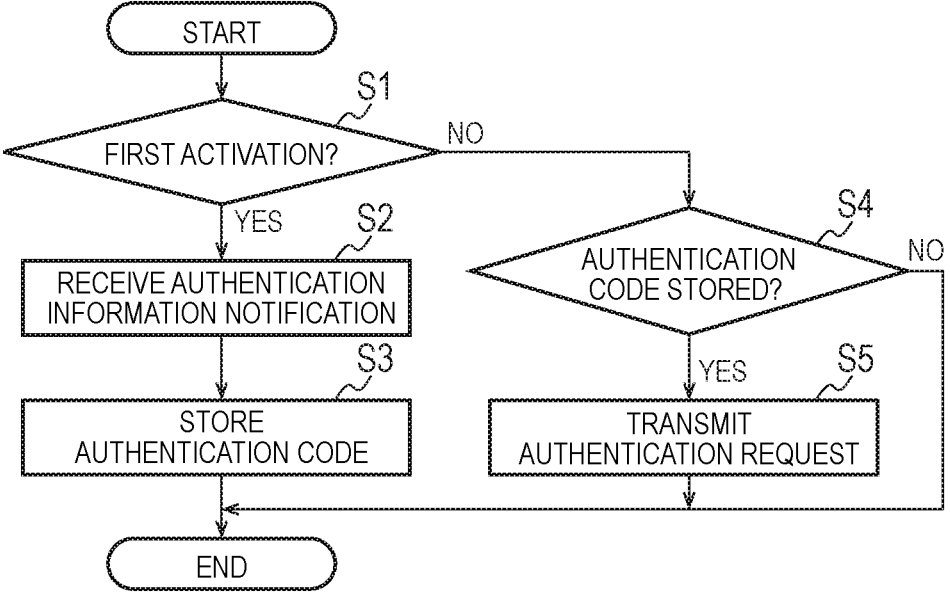
FIG. 3 is a flow chart showing a processing operation of a host according to the first embodiment.

FIG. 3 is a flow chart showing a processing operation of the host 3 according to the first embodiment. The host 3 performs the operation shown in FIG. 3 every time the semiconductor memory 1 to which the host 3 is connected is started (activated).

When the semiconductor memory 1 is activated (START), the host 3 determines whether it is the first activation of the semiconductor memory 1 (S1).

At step S1, if the semiconductor memory 1 is activated for the first time (YES: S1), the host 3 receives an authentication information notification from the semiconductor memory 1 (S2).

Upon the receipt of the authentication information notification, the host 3 stores an authentication code of the semiconductor memory 1, which is included in the authentication information notification, in the authentication code memory 21 (S3). If the authentication code memory 21 has stored an authentication code of a different semiconductor memory 1, the host 3 overwrites the authentication code.

Alternatively, the host 3 causes the authentication code memory 21 to store each authentication code in association with a corresponding semiconductor memory 1. When step S3 is finished, the host 3 ends the operation of the flow chart shown in FIG. 3 (END).

At step S1, if the semiconductor memory 1 is not activated for the first time (NO: S1), the host 3 determines whether the authentication code memory 21 stores the authentication code (S4).

At step S4, if the authentication code memory 21 stores an authentication code (YES: S4), the host 3 reads the authentication code and transmits the authentication request to the semiconductor memory 1 to which it is connected (S5). If more than one semiconductor memories 1 is connected to the host 3, the host 3 reads the authentication code of the corresponding one of the semiconductor memories 1, and transmits an authentication request to the semiconductor memory 1 relating to the authentication code.

If step S5 is finished, the host 3 ends the process of the flow chart shown in FIG. 3 (END).

If the authentication code is not stored in the authentication code memory 21 at step S4 (NO: S4), the host 3 ends the process of the flow chart shown in FIG. 3 (END).

Figure 4:
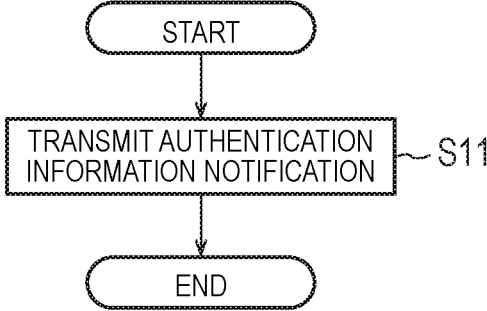
FIG. 4 is a flow chart showing a processing operation of the semiconductor memory according to the first embodiment.

FIG. 4 is a flow chart showing a processing operation of the semiconductor memory according to the first embodiment. FIG. 4 shows the processing operation of the semiconductor memory 1 when it is activated for the first time.

When the semiconductor memory 1 is started for the first time (START), the semiconductor memory 1 transmits an authentication information notification to the host 3 (S11). The authentication information notification includes the authentication code of the semiconductor memory 1. The authentication code is information that is specific to each semiconductor device, and used for authentication processing. Although FIG. 4 shows that the process ends when the step S11 is finished (END), upon the receipt of the authentication information notification, the host 3 may send a reception response to the semiconductor memory 1 indicating that the authentication information notification is received. For example, the semiconductor memory 1 sends the authentication information notification to the host 3 when it is confirmed that the semiconductor memory 1 is activated for the first time based on the activation information stored in the activation information memory 20.

Figure 5:
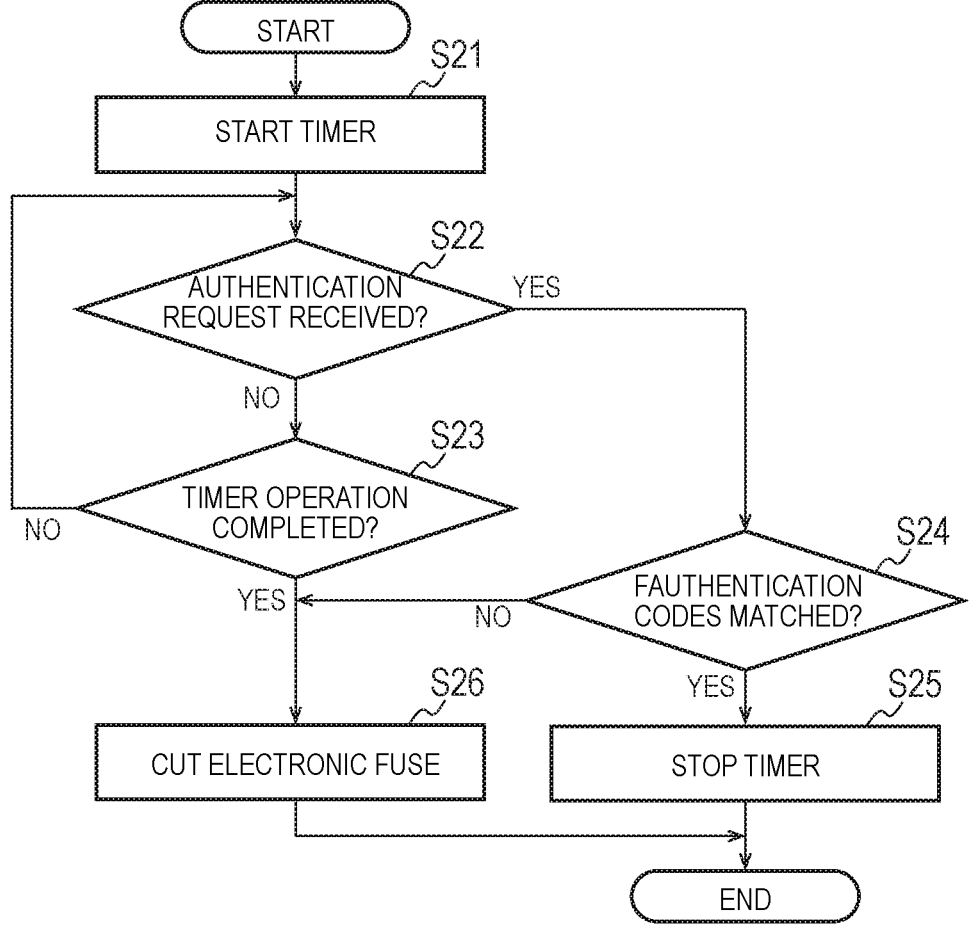
FIG. 5 is a diagram showing a processing operation when the semiconductor memory according to the first embodiment is activated for the second or later time.

FIG. 5 is a diagram showing a processing operation when the semiconductor memory according to the first embodiment is activated for the second of later time.

When the semiconductor memory 1 is activated for the second or later time (START), the semiconductor memory 1 starts the timer 14 (S21). The timer 14 then starts measuring time. For example, the semiconductor memory 1 starts the timer 14 for measuring time when it is confirmed based on the activation information stored in the activation information memory 20 that the semiconductor memory 1 is activated for the second or later time.

The semiconductor memory 1 then determines whether it has received the authentication request from the host 3 connected thereto (S22).

At step S22, when the authentication request has not been received (NO: S22), the semiconductor memory 1 determines whether the time-up occasion has come to the timer 14, that is, whether the operation of the timer 14 is completed (S23).

If the time-up occasion has not come to the timer 14 (NO: S23), the semiconductor memory 1 repeats step S22.

If the authentication information has been received at step S22 (YES: S22), the semiconductor memory 1 determines whether the authentication code included in the authentication request matches the authentication code included in the authentication information notification transmitted to the host 3 at step S11 in FIG. 4 (S24).

If the authentication code included in the authentication request matches the authentication code included in the authentication information notification at step S24 (YES: S24), the semiconductor memory 1 stops the timer 14 (S25). In this case, the debug port controller 10 does not disable the communication port 16.

If the operation of the timer 14 is completed at step S23 (YES: S23), or if the authentication code included in the authentication request does not match the authentication code included in the authentication information notification at step S24 (NO: S24), the block controller 18 of the debug port controller 10 sends an instruction signal to the communication blocker 17 to cut the electronic fuse so as to block the communication path of the communication port 16 (S26).

Thus, in the first embodiment, every time the semiconductor memory 1 is started, the host 3 transmits an authentication request to the semiconductor memory 1. The semiconductor memory 1 performs authentication processing. If the authentication codes do not match each other, the communication port 16 used for debugging is blocked. As a result, even if the semiconductor memory 1 has been shipped with the communication port 16 for the debugging of the semiconductor memory 1 not being blocked, the communication port 16 may be blocked at the activation of the semiconductor memory 1 if the authentication codes do not match each other. Therefore, the possibility may be avoided that a third party may analyze the inside of the semiconductor memory 1 using the communication port 16 that has not been blocked without any purpose.

The semiconductor memory 1 according to the first embodiment is very advantageous since even if the communication port 16 that may be used for debugging has not been blocked when the semiconductor memory 1 is shipped, the communication port 16 may be automatically blocked after the shipment.

Second Embodiment

A second embodiment includes a more specified communication port 16.

Figure 6:
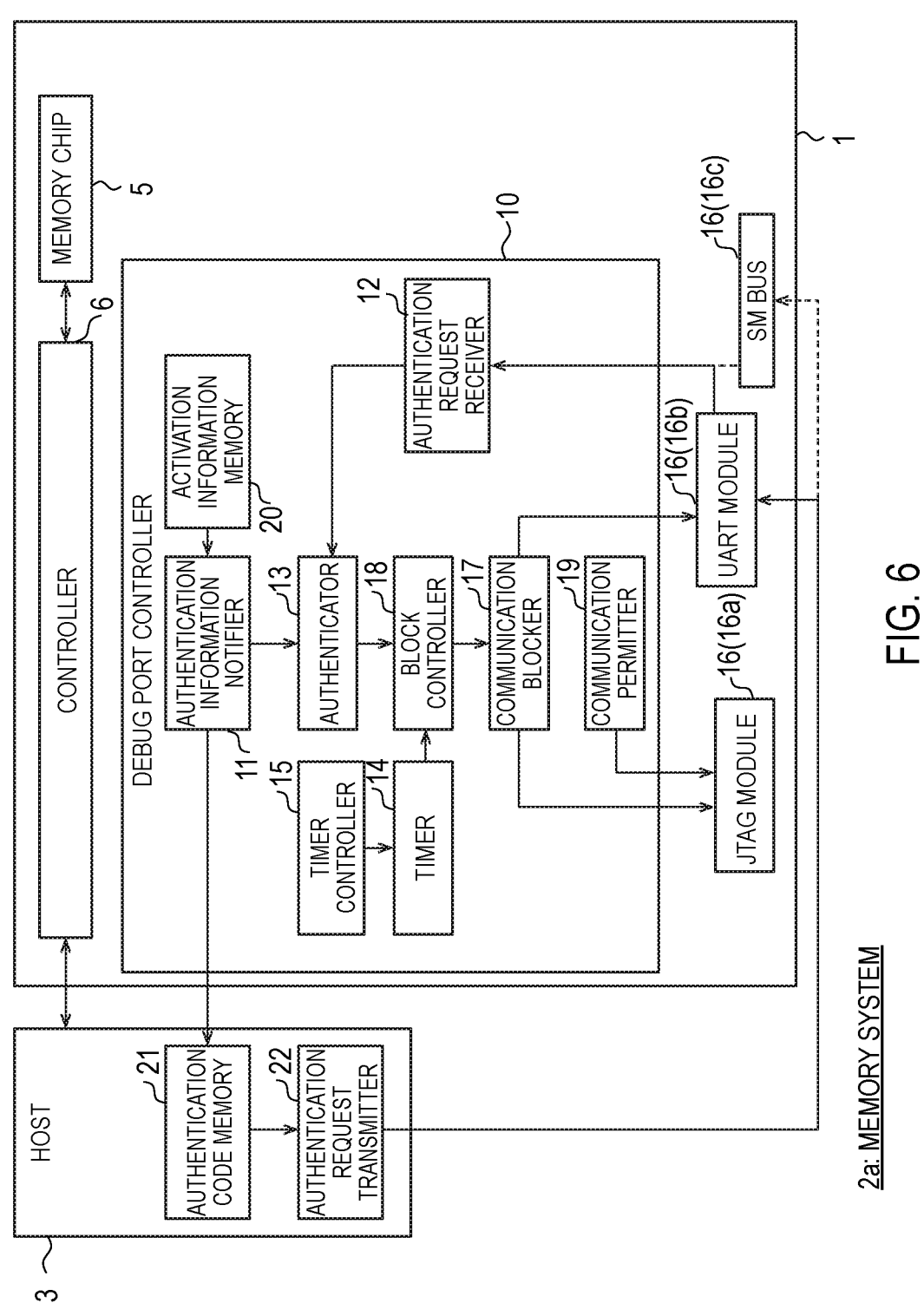
FIG. 6 is a block diagram illustrating a configuration of a memory system according to a second embodiment.

FIG. 6 is a block diagram illustrating a configuration of a memory system 2a according to the second embodiment. In FIG. 6, the components that are common to those in FIG. 1 have the same reference numerals.

The semiconductor memory 1 according to the second embodiment includes three communication ports 16, which are a JTAG module 16a, a UART module 16b, and a system management (SM) bus 16c.

In the second embodiment, the authentication request is received by the UART module 16b or the SM bus 16c.

In the semiconductor memory 1 according to the second embodiment, the JTAG module 16a is disabled until the authenticator 13 determines that the authentication codes match each other. The reason why the JTAG module 16a is disabled is that, since the JTAG module 16a is a communication port 16 intended to analyze the inside of the semiconductor memory 1, if the JTAG module 16a may be used before the authentication codes match each other, the JTAG module 16a may be used for an improper purpose. To make a disabled state of the JTAG module 16a, for example, the communication permitter 19 according to the second embodiment may supply a power supply voltage to the JTAG module 16a after the authenticator 13 determines that the authentication codes match each other. The UART module 16b or the SM bus 16c functions as a first communication port used to transmit the authentication information notification from the authentication information notifier 11 to the host 3 and receive authentication information from the host 3. The JTAG module 16a functions as a second communication port that is disabled until the authenticator 13 determines that the authentication codes match each other, and permitted to start communications by the communication permitter 19 when the authenticator 13 determines that the authentication codes match each other.

The timer 14 according to the second embodiment measures time independently of the operation of the controller 6. As a result, the controller 6 cannot control the timer 14. Thus, even if the controller 6 is manipulated from the outside, the timer 14 cannot be controlled. Therefore, when the "time-up" occasion comes to the timer 14, the semiconductor memory 1 may block the communication port 16.

As described above, the semiconductor memory 1 according to the second embodiment receives the authentication request from the host 3 at the UART module 16b or the SM bus 16c that is unlikely to be used for an internal analysis. The semiconductor memory 1 according to the second embodiment enables the JTAG module 16a, which may possibly be used for an internally analysis, only when the authenticator 13 determines that the authentication codes match each other. Thus, the JTAG module 16a is not used before the authentication processing of the authenticator 13 is completed. Therefore, the risk that a third party may analyze the inside of the semiconductor memory 1 before the authentication processing of the authenticator 13 is completed may be lowered.

Furthermore, since the timer 14 measures time independently of the operation of the controller 6, even if the controller 6 may be hacked, the semiconductor memory 1 may block the communication port 16 when the time-up occasion comes to the timer 14.

Third Embodiment

A debug port controller 10 according to a third embodiment is mounted on a substrate that is separate from the SoC of the semiconductor memory 1. A new SoC including the debug port controller 10 according to the first embodiment may be produced and mounted on the substrate. Alternatively, one or more of the authentication information notifier 11, the authentication request receiver 12, the authenticator 13, the timer 14, the timer controller 15, the communication blocker 17, and the block controller 18 included in the debug port controller 10 may be mounted on the substrate as discrete components.

Figure 7:
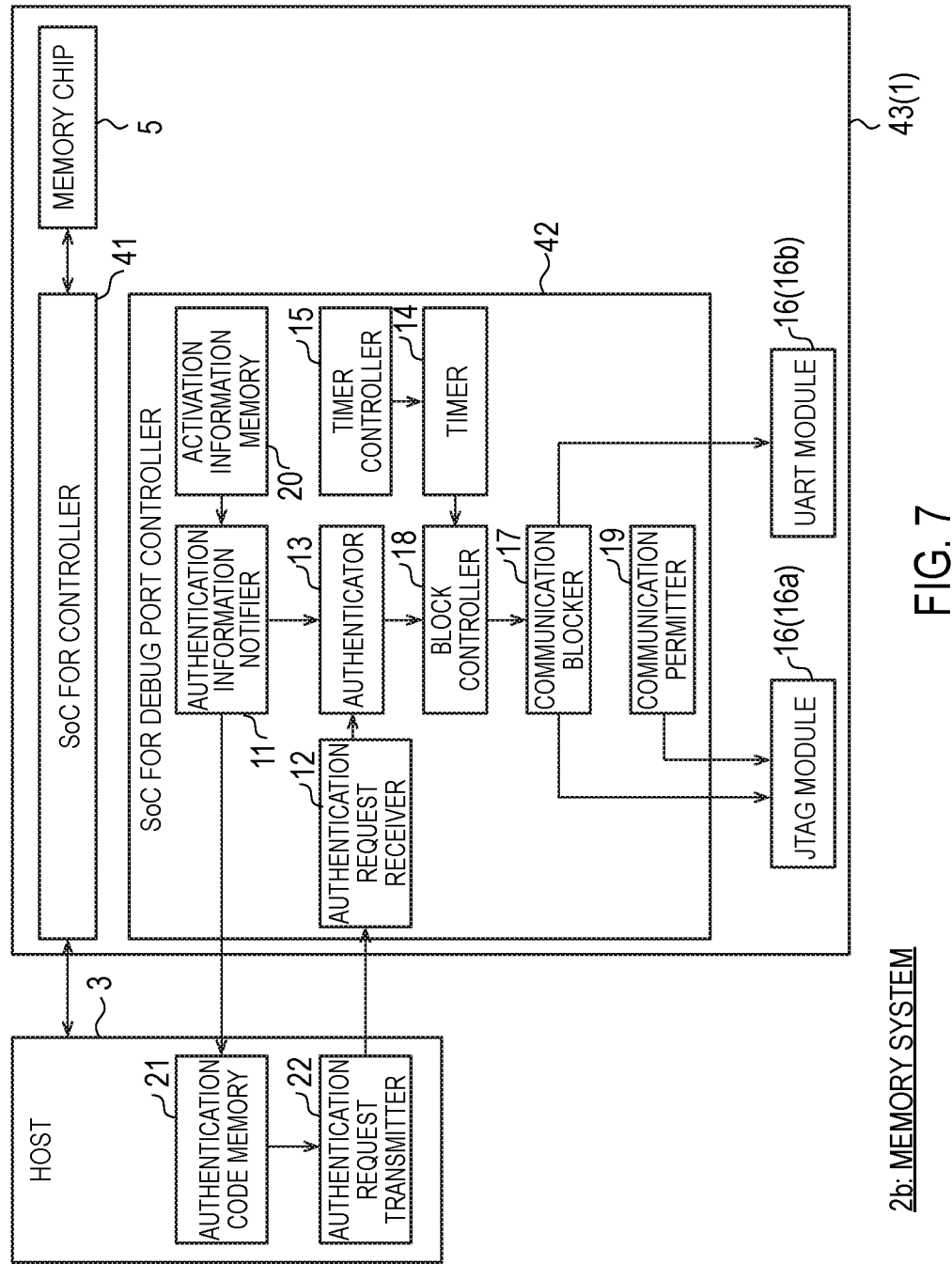
FIG. 7 is a block diagram illustrating a configuration of a memory system according to a third embodiment.

FIG. 7 is a block diagram illustrating a configuration of a memory system 2c according to the third embodiment. The memory system 2c according to the third embodiment includes the memory chip 5, an SoC 41 used for the controller 6, and an SoC 42 including the debug port controller 10, the SoC 42 being disposed separate from the SoC 41. The memory chip 5, the SoC 41, and the SoC 42 may be mounted on the same substrate 43 or on different substrates.

The semiconductor memory 1 according to the third embodiment may be formed by using the memory chip 5, the SoC 41 for the controller 6 as they are. Although the SoC 42 including the debug port controller 10 may need to be newly formed or a discrete component for the debug port controller 10 may need to be prepared in the third embodiment, changes in hardware may not be great, and the memory system 2a may be formed at a low cost.

The above-described embodiments may be configured as follows.

[1] A memory having a first authentication code comprising:
a communication port configured to transmit information including debug data to or receive the information including debug data from the external device; and
a debug port controller that is usable for blocking of a communication path connecting to the communication port; wherein
the debug port controller is configured to:
receive an authentication request including a second authentication code from an external device;
determine whether the second authentication code matches the first authentication code; and
block the communication path if the second authentication code is not determined to match the first authentication code.

[2] The memory according to [1], wherein the communication port is configured to be disabled until the second authentication code matches the first authentication code.

[3] The memory according to [1] or [2], further comprising a communication permitter configured to permit the communication port.

[4]. The memory according to [3],
wherein the communication port is configured to:
be disabled until the second authentication code matches the first authentication code, and
be permitted to start communications if the second authentication code is determined to match the first authentication code.

[5] The memory according to [4], wherein the communication port is enabled to be used for debugging after permitted to start communications by the communication permitter.

[6] The memory according to [4] or [5], wherein the communication port is for a universal asynchronous receiver/transmitter (UART) or a system management (SM) bus, or the second communication port is for JTAG.

[7] The memory according to any one of [1] to [6], further comprising:
a timer to measure time,
a timer controller to stop the timer, and
an activation information memory configured to store activation information indicating whether the memory is started for the first time,
wherein the timer controller is configured to cause the timer to measure time when it is confirmed that the memory is started for the second or later time based on the activation information.

[8] The memory according to [7], further comprising a memory chip, and a controller configured to access the memory chip,
wherein the timer measures time independently of an operation of the controller.

[9] The memory according to any one of [1] to [7], further comprising a first chip, the first chip comprising a memory chip, and a controller configured to access the memory chip.

[10] The semiconductor memory according to any one of [1] to [9], wherein the communication path is an electronic fuse.

[11] A memory system comprising:

a memory having first authentication code; and a host device having second authentication code connected to the memory, the memory including:

a communication port configured to transmit information including debug data to or receive the information including debug data from an external device; and a debug port controller that is usable for blocking of a communication path connecting to the communication port; wherein the debug port controller is configured to:

receive an authentication request including the second authentication code from an external device;

determine whether the second authentication code included in the authentication request matches the first authentication code; and block the communication path if the second authentication code is not determined to match the first authentication code, the host device is configured to transmit the authentication request including the second authentication code to the connected memory.

[12] The memory system according to [11], wherein the host device is configured to transmit the authentication request including the second authentication code to the memory every time the memory is started after the first time.

[13] A method of controlling a storage device including a communication port and having a first authentication code, the method including:

receive an authentication request including a second authentication code from a host device;

block the communication port so that data for debugging cannot be received if the second authentication code does not match the second authentication code, and maintain connecting the communication port so that data for debugging can be received if the first authentication code and the second authentication code match.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A memory having a first authentication code, comprising:

a communication port configured to transmit information including debug data to or receive the information including the debug data from an external device;

an activation information memory configured to store activation information indicating whether the memory is activated for a first time; and a debug port controller that is usable for blocking a communication path connecting to the communication port, wherein the debug port controller is configured to:

receive an authentication request including a second authentication code from the external device, wherein an authentication notification is sent to the external device when the memory is activated for the first time, and wherein sending the authentication notification causes at least the external device to send the authentication request;

determine whether the second authentication code matches the first authentication code; and block the communication path if the second authentication code is not determined to match the first authentication code.

2. The memory according to claim 1, wherein the communication port is configured to be disabled until the second authentication code matches the first authentication code.

3. The memory according to claim 1, further comprising a communication permitter configured to permit the communication port.

4. The memory according to claim 3, wherein the communication port is configured to:

be disabled until the second authentication code matches the first authentication code; and be permitted to start communications if the second authentication code is determined to match the first authentication code.

5. The memory according to claim 4, wherein the communication port is enabled to be used for debugging after being permitted to start communications by the communication permitter.

6. The memory according to claim 4, wherein the communication port is for a universal asynchronous receiver/transmitter (UART) or a system management (SM) bus, and wherein the memory further comprises a second communication port for JTAG.

7. The memory according to claim 1, further comprising:

a timer to measure time; and a timer controller to stop the timer, wherein the timer controller is configured to cause the timer to measure the time until a predetermined time when it is confirmed that the memory is started for a second time or a later time based on the activation information.

8. The memory according to claim 7, further comprising a memory chip, and a controller configured to access the memory chip, wherein the timer measures the time independently of an operation of the controller.

9. The memory according to claim 1, further comprising a first chip, the first chip comprising a memory chip, and a controller configured to access the memory chip.

10. The memory according to claim 1, wherein the communication path is an electronic fuse.

11. A memory system comprising:

a memory having a first authentication code; and a host device having a second authentication code connected to the memory, wherein the host device is configured to transmit an authentication request including the second authentication code to the memory, the memory including:

a communication port configured to transmit information including debug data to or receive the information including the debug data from an external device;

an activation information memory configured to store activation information indicating whether the memory is activated for a first time; and a debug port controller that is usable for blocking communication path connecting to the communication port, wherein the debug port controller is configured to:

receive the authentication request including the second authentication code from the external device, wherein an authentication notification is sent to the external device when the memory is activated for the first time indicated by the activation information, and wherein sending the authentication notification causes at least the external device to transmit the authentication request;

determine whether the second authentication code included in the authentication request matches the first authentication code; and block the communication path if the second authentication code is not determined to match the first authentication code.

12. The memory system according to claim 11, wherein the host device is configured to transmit the authentication request including the second authentication code to the memory every time the memory is activated for the first time.

13. A method of controlling a storage device including a communication port and having a first authentication code, the method including:

storing, in an activation information memory of the storage device, activation information indicating whether a memory is activated for a first time;

receiving an authentication request including a second authentication code from a host device, wherein an authentication notification is sent to the host device when the memory is activated for the first time indicated by the activation information, and wherein sending the authentication notification causes at least the host device to transmit the authentication request;

blocking the communication port so that debug data cannot be received if the first authentication code does not match the second authentication code; and maintaining a communication port connection so that the debug data can be received if the first authentication code and the second authentication code match.

14. The memory of claim 6, wherein the second communication port is not allowed to be reconnected when the debug port controller determines the second authentication code does not match the first authentication code.

15. The memory system of claim 11, wherein the memory system further comprises a second communication port, and wherein the second communication port is not allowed to be reconnected when the debug port controller determines the second authentication code does not match the first authentication code.

16. The method of claim 13, wherein the storage device includes a debug port controller and a second communication port, and wherein the second communication port is not allowed to be reconnected when the debug port controller determines the second authentication code does not match the first authentication code.

17. The memory of claim 1, wherein the activation information correlates to an activation flag generated by software.

* * * * *